United States Patent
Braune et al.

(10) Patent No.: US 7,851,988 B2
(45) Date of Patent: Dec. 14, 2010

(54) GREEN-EMITTING LED

(75) Inventors: Bert Braune, Wenzenbach (DE); Herbert Brunner, Sinzing (DE); Tim Fiedler, München (DE); Frank Jermann, München (DE); Martin Zachau, Geltendorf (DE)

(73) Assignees: Osram Gesellschaft mit beschränkter Haftung, München (DE); Osram Opto Semiconductors GmbH, Regensburg (DE)

( * ) Notice: Subject to any disclaimer, the term of this patent is extended or adjusted under 35 U.S.C. 154(b) by 1023 days.

(21) Appl. No.: 10/572,891

(22) PCT Filed: Sep. 24, 2004

(86) PCT No.: PCT/DE2004/002136

§ 371 (c)(1),
(2), (4) Date: Mar. 20, 2006

(87) PCT Pub. No.: WO2005/030904

PCT Pub. Date: Apr. 7, 2005

(65) Prior Publication Data
US 2007/0034885 A1    Feb. 15, 2007

(30) Foreign Application Priority Data
Sep. 24, 2003   (DE) ................. 103 44 376

(51) Int. Cl.
*H05B 33/04*   (2006.01)
*C09K 11/02*   (2006.01)
*C09K 11/72*   (2006.01)

(52) U.S. Cl. ................. 313/503; 252/301.4 R; 252/301.6 R

(58) Field of Classification Search ......... 313/498–512; 252/301.4 F, 301.4 R, 301.6 R
See application file for complete search history.

(56) References Cited

U.S. PATENT DOCUMENTS

| 6,255,670 | B1 | 7/2001 | Srivastava et al. | |
|---|---|---|---|---|
| 6,670,748 | B2* | 12/2003 | Ellens et al. | 313/503 |
| 6,717,353 | B1* | 4/2004 | Mueller et al. | 313/501 |
| 7,061,024 | B2* | 6/2006 | Schmidt et al. | 257/98 |
| 2002/0043926 | A1 | 4/2002 | Takahashi et al. | |
| 2003/0094893 | A1* | 5/2003 | Ellens et al. | 313/503 |
| 2003/0168643 | A1* | 9/2003 | Mitomo et al. | 252/500 |
| 2004/0124758 | A1* | 7/2004 | Danielson et al. | 313/486 |

(Continued)

FOREIGN PATENT DOCUMENTS

DE    198 06 536 A1    8/1989

(Continued)

OTHER PUBLICATIONS

J.W.H. van Krevel, "On new rare-earth doped M-Si-Al-O-N materials—Luminescence properties and oxidation resistance", Chapter 6, Luminescence of Ln-Si-O-N:Tb (Ln=Y, Gd, La), pp. 73-87 2000, ISBN 90-386-2711-4.

(Continued)

*Primary Examiner*—Joseph L Williams
(74) *Attorney, Agent, or Firm*—Cohen Pontani Lieberman & Pavane LLP

(57) ABSTRACT

Phosphor from the class of the oxynitridosilicates, having a cation M which is doped with divalent europium and having the empirical formula $M_{(1-c)}Si_2O_2N_2:D_c$, where M=Sr or $M=Sr_{(1-x-y)}Ba_yCa_x$ with $x+y<0.5$ is used, the oxynitridosilicate completely or predominantly comprising the high-temperature-stable modification HT.

16 Claims, 4 Drawing Sheets

U.S. PATENT DOCUMENTS

| | | | |
|---|---|---|---|
| 2004/0155225 A1* | 8/2004 | Yamada et al. | 252/301.4 R |
| 2005/0042743 A1* | 2/2005 | Kawai et al. | 435/287.2 |
| 2005/0156496 A1* | 7/2005 | Takashima et al. | 313/237 |
| 2005/0253500 A1* | 11/2005 | Gotoh et al. | 313/486 |
| 2006/0011922 A1* | 1/2006 | Schmidt et al. | 257/76 |
| 2007/0018567 A1* | 1/2007 | Hirosaki | 313/503 |
| 2007/0040152 A1* | 2/2007 | Oshio | 252/301.16 |
| 2007/0080326 A1* | 4/2007 | Fiedler et al. | 252/301.4 F |
| 2007/0248519 A1* | 10/2007 | Mitomo et al. | 423/263 |

FOREIGN PATENT DOCUMENTS

| | | |
|---|---|---|
| DE | 100 24 924 A1 | 11/2001 |
| EP | 0 584 599 A1 | 8/1993 |
| EP | 1 150 361 A1 | 4/2001 |
| EP | 1 411 558 A | 4/2004 |
| EP | 1 413 618 A | 4/2004 |
| JP | 2004-134805 | 4/2004 |
| WO | WO 01/89001 A2 | 11/2001 |
| WO | WO 2004036962 A1 * | 4/2004 |

OTHER PUBLICATIONS

Krevel, et al., "Luminescence Properties of Terbium-, Cerium, or Europium-Doped Alpha-Sialon Materials", Journal of Solid State Chemistry, Orlando, FL, vol. 165, No. 1, pp. 19-24, Apr. 2002.

Xie et al., "Preparation and Luminescence Spectra of Calcium-and Rare-Earth (R=Eu, TB, and PR)-Codoped Alpha-Sion Ceramics", Journal of the American Ceramic Society, American Ceramic Society, Columbus, US, vol. 85, No. 5, pp. 1229-1234, Oct. 2000.

* cited by examiner

GREEN-EMITTING LED

RELATED APPLICATION

This is a U.S. national stage of application No. PCT/DE2004/002136, filed on 24 Sep. 2004.

U.S. patent application Ser. Nos. 10/573,398 (now U.S. Pat. No. 7,550,095), 10/574,021 and 10/574,026.

FIELD OF THE INVENTION

The invention is based on a green-emitting LED. The term green-emitting is understood in the present context as meaning an emission in the region around 560 nm.

BACKGROUND OF THE INVENTION

It is customary for an LED with colored emission to be realized by a correspondingly adapted chip. However, this presents problems in the case of green emission, since established techniques, such as an InGaN chip (blue) or an InGaAlP chip (red) cannot be used on account of lack of efficiency. Instead, special solutions have to be employed. Examples of special solutions of this nature are to be found in EP 584 599, DE 198 06 536 and DE 100 24 924. However, they still have a relatively low efficiency. Moreover, they have a relatively strong temperature drift in the color locus of the emission.

Therefore, green-emitting LEDs based on luminescence conversion LEDs have been developed as an alternative. Examples are to be found in WO 01/89001 and EP 1 150 361. However, it has not hitherto been possible to achieve a higher efficiency than with direct-emitting LEDs. This is because of the phosphors (BAM derivatives and sulfides) which have hitherto been available for this purpose and their excitability.

Phosphors of the oxynitridosilicate type are known per se under the shortened formula MSiON; cf. for example "On new rare-earth doped M—Si—Al—O—N materials", J. van Krevel, TU Eindhoven 2000, ISBN 90-386-2711-4, Chapter 6. They are doped with Tb. Emission is achieved under excitation by 365 nm or 254 nm.

A new type of phosphor is known from the as yet unpublished EP patent application 02 021 117.8 (Docket 2002P15736). It consists of Eu- or Eu,Mn-coactivated oxynitridosilicate of formula $MSi_2O_2N_2$ (M=Ca, Sr, Ba).

SUMMARY OF THE INVENTION

It is an object of the present invention to provide a green-emitting LED which is designed as a luminescence conversion LED with the highest possible efficiency. A further object is to stabilize the color locus.

This and other objects are attained in accordance with one aspect of the present invention directed to a green-emitting LED which is designed as a luminescence conversion LED, comprising a primary radiation source, which is a chip emitting in the UV or blue radiation region, and a layer of a phosphor which is arranged in front of the primary radiation source and completely or partially converts the radiation of the chip into green light of dominant wavelength $\lambda_{dom}$=550 to 570 nm, wherein the phosphor belongs to the class of the oxynitridosilicates, having a cation M and the empirical formula $M_{(1-c)}Si_2O_2N_2:D_c$, where D denotes a doping with divalent europium and where M comprises Sr as a constituent and M=Sr alone or M=$Sr_{(1-x-y)}Ba_yCa_x$ with $0 \leq x+y<0.5$ is used, the oxynitridosilicate completely or predominantly comprising the high-temperature-stable modification HT.

Hitherto, there has not been a green-emitting, high-efficiency phosphor which is simultaneously insensitive to external influences and would be usable in an LED.

An embodiment of the invention utilizes a phosphor which represents an oxynitridosilicate of formula $MSi_2O_2N_2$ (M=Ca, Sr, Ba) which is activated with divalent Eu, if appropriate with the further addition of Mn as co-activator, with the HT phase forming the majority or all of the phosphor, i.e. more than 50% of the phosphor. This HT modification is distinguished by the fact that it can be excited within a broad band, namely in a wide range from 200 to 480 nm, that it is extremely stable with respect to external influences, i.e. does not reveal any measurable degradation at 150° C., and that it has an extremely good color locus stability under fluctuating conditions (little drift detectable between 20 and 100° C.). This phosphor is often also referred to below as Sr Sion:Eu.

When producing the novel phosphor, it is important in particular to use a high temperature, the synthesis range lying between 1300 and 1600° C. Another determining factor is the reactivity of the starting components, which should be as high as possible.

This phosphor can in particular be excited efficiently by an LED, in particular of the InGaN type.

The phosphor $MSi_2O_2N_2$:Eu (M=Ca, Sr, Ba) which is known from EP patent application 02 021 117.8, in the case of the Sr-dominated embodiment with M=Sr or M=$Sr_{(1-x-y)}Ba_yCa_x$ with x+y<0.5, referred to below as Sr Sion, is difficult to control. Although some test conditions give excellent results, there has hitherto been no guiding principle as to how to obtain desired results in a reliable way. An additional factor is a certain tendency of the efficiency of the phosphor to be reduced and the color locus to vary excessively under high thermal loads.

Surprisingly, it has now been found that the two phases fundamentally differ in terms of their suitability for use as a phosphor. Whereas the LT phase is of only limited use as an Eu-doped phosphor and tends to emit orange-red light, the HT phase has an excellent suitability for use as a phosphor which emits green light. There is often a mixture of the two modifications which manifests both forms of emission over a broad band. It is therefore desirable for the HT phase to be produced in as pure a form as possible, in a proportion of at least 50%, preferably at least 70%, particularly preferably at least 85%.

This requires an annealing process which is carried out at least 1300° C. but no more than 1600° C. A temperature range from approximately 1450 to 1580° C. is preferred, since LT phase is formed to an increasing extent at lower temperatures and the phosphor becomes increasingly difficult to process at higher temperatures; above approximately 1600° C. it forms a hard-sintered ceramic or melt. The optimum temperature range depends on the precise composition and the properties of the starting materials.

A batch of the starting products which is substantially stoichiometric using the base components $SiO_2$, $SrCO_3$ and $Si_3N_4$ is particularly important for producing an efficient phosphor of the Sr Sion type. Sr acts as a representative example of M in this context. The deviation should amount to no more than in particular 10%, preferably 5%, from the ideal stoichiometric batch, including any addition of a melting auxiliary, as is often customary. A maximum deviation of 1% is particularly preferred. In addition, there is a precursor for the europium fraction of the doping, realized, for example, as oxide $Eu_2O_3$. This discovery runs contrary to the previous procedure of adding the base component $SiO_2$ in a significantly substoichiometric proportion. This discovery is also particularly surprising on account of the fact that other Sions which are recommended for use as phosphors, such as Ba Sion in accordance with the teaching of EP patent application 02 021 117.8, should indeed be produced with a substoichiometric quantity of $SiO_2$.

Therefore, a corresponding batch for the Sr Sion $MSi_2O_2N_2$ uses 11 to 13% by weight of $SiO_2$, 27 to 29% by weight of $Si_3N_4$, remainder $SrCO_3$. Ba and Ca fractions in M are correspondingly added as carbonates. Europium is added, in accordance with the desired doping, for example as an oxide or fluoride, as a replacement for $SrCO_3$. The batch $MSi_2O_2N_2$ is also to be understood as encompassing any deviations from the exact stoichiometry, provided that they are compensated for with a view to charge retention.

It has proven particularly expedient for the starting components of the host lattice, in particular $Si_3N_4$, to have the highest possible purity. Therefore, $Si_3N_4$ which is synthesized from the liquid phase, for example starting from silicon tetrachloride, is particularly preferred. In particular the contamination with tungsten and cobalt has proven critical. The impurity level of each of these constituents should be as low as possible, in particular it should be less than 100 ppm, in particular less than 50 ppm, based on these precursor substances. Furthermore, the highest possible reactivity is advantageous; this parameter can be quantified by the reactive surface area (BET), which should be at least 6 $m^2/g$, advantageously at least 8 $m^2/g$. The impurity level of aluminum and calcium, based on this precursor substance $Si_3N_4$, should also as far as possible be less than 100 ppm.

In the event of a deviation from the above procedure with regard to a stoichiometric batch and temperature management, increasing levels of undesirable foreign phases, namely nitridosilicates $M_xSi_yN_z$, such as for example M2Si5N8, are formed if the addition of $SiO_2$ is set at too low a level, so that an excess of nitrogen is produced. Although this compound per se is a useful phosphor, with regard to the synthesis of the Sr Sion, it is extremely disruptive just like other nitridosilicates, since these foreign phases absorb the green radiation of the Sr Sion and may convert it into the known red radiation provided by the nitridosilicates. Conversely, if too much $SiO_2$ is added, Sr silicates, such as for example $Sr_2SiO_4$, are formed, since an excess of oxygen is produced. Both foreign phases absorb the useful green emission or at least lead to lattice defects such as vacancies, which have a considerable adverse effect on the efficiency of the phosphor. The starting point used is the basic principle that the level of the foreign phases should be as far as possible below 15%, preferably even below 5%. In the XRD spectrum of the synthesized phosphor, this corresponds to the requirement that with the XRD diffraction angle 2Θ in the range from 25 to 32°, the intensity of all the foreign phase peaks should be less than ⅓, preferably less than ¼, particularly preferably less than ⅕, of the intensity of the main peak characterizing the HT modification at approximately 31.8°. This applies in particular to the foreign phases of type $Sr_xSi_yN_z$, in particular Sr2Si5N8.

With an optimized procedure, it is reliably possible to achieve a quantum efficiency of from 80 to well over 90%. By contrast, if the procedure is not specific, the efficiency will typically lie in the range from at most 50 to 60% quantum efficiency.

Therefore, according to the invention it is possible to produce a phosphor which represents an oxynitridosilicate of formula $MSi_2O_2N_2$ (M=Ca, Sr, Ba) which is activated with divalent Eu, if appropriate with the further addition of Mn as co-activator, with the HT phase forming the majority or all of the phosphor, i.e. more than 50% of the phosphor, preferably more than 85% of the phosphor. This HT modification is distinguished by the fact that it can be excited within a broad band, namely in a wide range from 50 to 480 nm, in particular 150 to 480 nm, particularly preferably from 250 to 470 nm, that it is extremely stable with respect to external influences, i.e. does not reveal any measurable degradation at 150° C. in air, and that it has an extremely good color locus stability under fluctuating conditions. Further plus points include its low absorption in the red, which is particularly advantageous in the case of phosphor mixtures. This phosphor is often also referred to below as Sr Sion:Eu. A majority of the HT modification can be recognized, inter alia, from the fact that the characterizing peak of the LT modification in the XRD spectrum at approximately 28.2° has an intensity of less than 1:1, preferably less than 1:2, compared to the peak with the highest intensity from the group of three reflections of the HT modification which lie in the XRD spectrum at 25 to 27°. The XRD spectra cited here in each case relate to excitation by the known Cu—$K_\alpha$ line.

With the same activator concentration, this phosphor reveals different emission characteristics than the LT variant of the same stoichiometry. The full width at half maximum of the HT variant is significantly lower in the case of the optimized HT variant than in the case of the simple mixture containing foreign phases and defects, and is in the range from 70 to 80 nm, whereas the simple mixture containing foreign phases and defects has a full width at half maximum of approximately 110 to 120 nm. The dominant wavelength is generally shorter, typically 10 tp 20 nm shorter, in the case of the HT modification than in the case of a specimen containing significant levels of foreign phases. An additional factor is that the efficiency of the high-purity HT modification is typically at least 20% higher, and in some cases significantly higher still, than in the case of the LT-dominated mixture or the mixture with a high level of foreign phases.

One characterizing feature of a sufficiently low level of the LT modification and foreign phases is a full width at half maximum (FWHM) of the emission of less than 90 nm, since the lower the level of foreign phases, the lower the proportion of the specific orange-red emission from the modification which is rich in foreign phases, in particular the nitridosilicate foreign phases Sr—Si—N—Eu such as in particular Sr2Si5N8:Eu.

The abovementioned typical reflections in the XRD spectrum, which reveal the different crystal structure, are another important factor, in addition to the reduced full width at half maximum, in establishing the characterization.

The dominant peak in the XRD spectrum of the HT modification is the peak at approximately 31.7°. Other prominent peaks are the three peaks of approximately the same intensity between 25 and 27° (25.3 and 26.0 and 26.3°), with the peak with the lowest diffraction being the most intensive. A further intensive peak is 12.6°.

This phosphor emits predominantly green light with a dominant wavelength in the range from 555 to 565 nm.

It is also possible to add a small amount of the AlO group as a replacement for the SiN group in the molecule of the oxynitridosilicate of formula $MSi_2O_2N_2$, in particular in an amount of up to at most 30% of the SiN content.

Both phases of the Sr Sion:Eu can crystallize analogously to the two structurally different host lattice modifications and can each be produced using the SrSi2O2N2:Eu batch stoichiometry. Minor deviations from this stoichiometry are possible. The Eu-doped host lattices surprisingly both luminesce when excited in the blue or UV region, but in each case after host lattice modification with a different emission color. The LT modification reveals an orange emission, the HT modification a green emission at approximately $\lambda_{dom}$=560 nm with in principle a significantly higher efficiency. A desired property of the phosphor can be set accurately as a function of the dopant content and dopant material (Eu or Eu, Mn) and the relative proportions of the HT and LT modifications.

One benefit of the HT phase is the fact that it can be excited with a good level of uniformity over a very wide spectral region with only minor variations in the quantum efficiency.

Moreover, within a wide temperature range the luminescence of the HT modification is only weakly dependent on the temperature. Therefore, the invention has for the first time discovered a green-emitting phosphor, preferably for LED applications, which makes do without special measures to stabilize it. This distinguishes it in particular from the phosphors which have previously been regarded as the most promising candidates for this purpose, namely thiogallate phosphors or chlorosilicates.

The Sion compounds with M=(Sr,Ba), preferably without Ba or with up to 10% of Ba, represent efficient phosphors with a wide range of emission maxima. These maxima are generally at a shorter wavelength than in the case of pure Sr Sion, preferably between 520 and 565 nm. Moreover, the color space which can be achieved can be widened by adding small amounts (preferably up to 30 mol %) of Ca and/or zinc; this shifts the emission maxima toward the longer-wave region compared to pure Sr Sion, and by partially (up to 25 mol %) replacing Si with Ge and/or Sn.

A further embodiment is for M, in particular Sr, to be partially substituted by trivalent or monovalent ions, such as La3+ or Li+. It is preferable for these ions to form at most 20 mol % of the M.

Surprisingly, the Sr Sion of the HT phase has now led to a phosphor which can be set exactly to an emission of wavelength $\lambda_{dom}$=560 nm (dominant wavelength). The phosphor converts the light from a blue or UV LED with a quantum efficiency of significantly more than 80%. The lumen-based efficiency is comparable to that of typical white LEDs based on YAG:Ce.

Therefore, a "pure green" conversion LED is almost one order of magnitude more efficient than the pure semiconductor variant.

A further advantage is that the emission color of the luminescence conversion LED is virtually independent of the operating temperature, and consequently the LED can be operated at different outside temperatures and can be dimmed with a stable color locus.

Furthermore, the invention relates to an illumination system having LEDs as described above, the illumination system also including electronic components which, by way of example, impart dimmability. A further purpose of the electronics is to actuate individual LEDs or groups of LEDs. These functions may be realized by known electronic components.

DETAILED DESCRIPTION OF THE DRAWINGS

Figure 1:
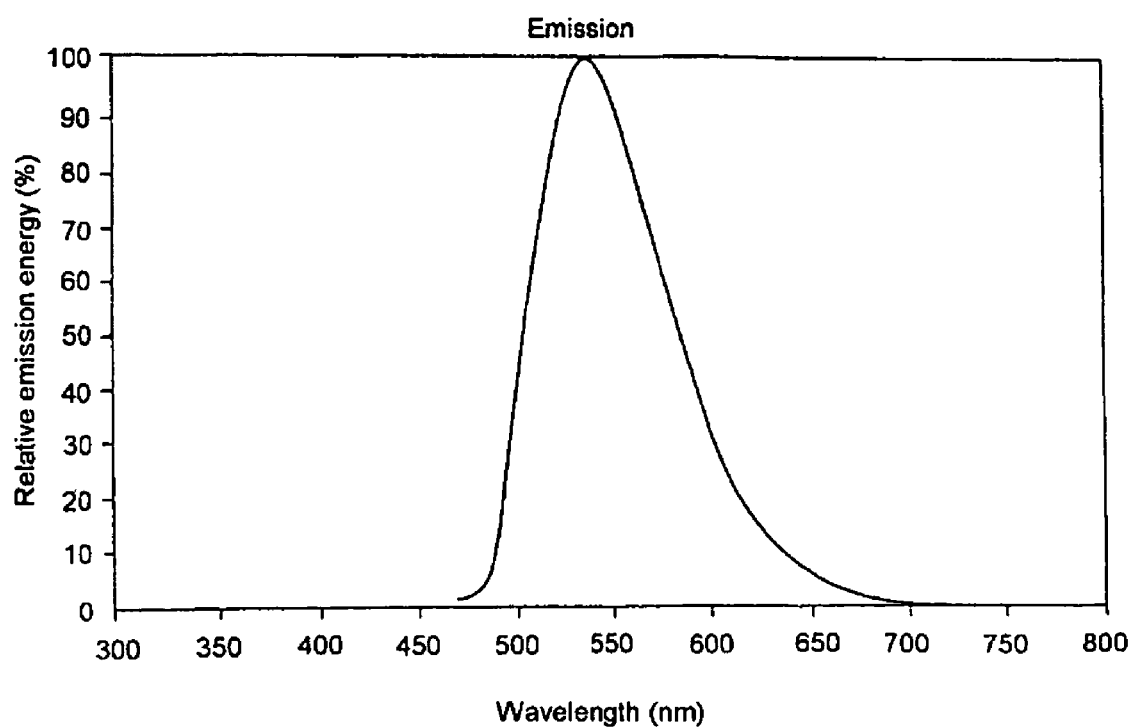
FIG. 1 shows an emission spectrum for a first oxynitridosilicate.

FIG. 1 shows a specific example for the phosphor according to the invention. This example relates to the emission of the phosphor $SrSi_2N_2O_2$: (5% $Eu^{2+}$) in the HT modification, in which the Eu fraction forms 5 mol % of the lattice sites occupied by Sr. The emission maximum is at 540 nm, the mean wavelength $\lambda_{dom}$ at 558 nm. The color locus is x=0.357; y=0.605. The excitation in this case took place at 460 nm. The FWHM is 76 nm. The quantum efficiency is approximately 90%. The color locus is x=0.357, y=0.605.

Figure 2:
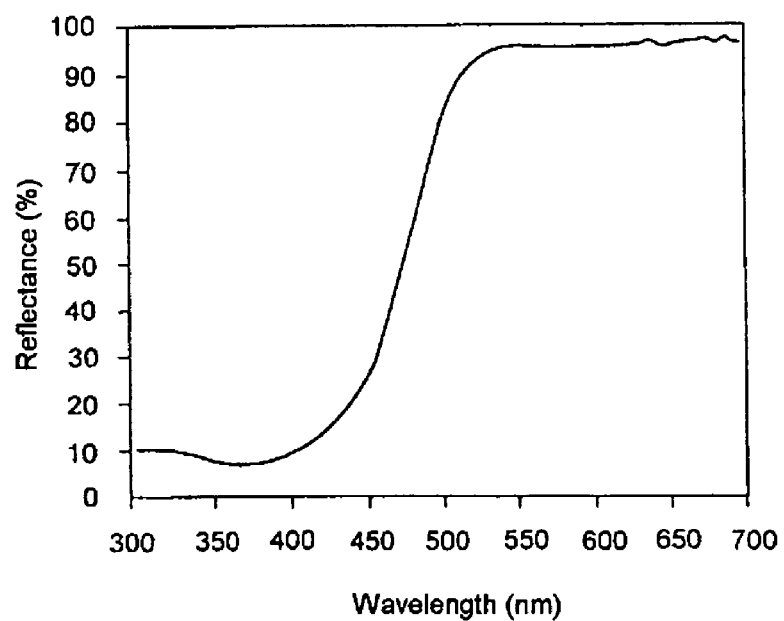
FIG. 2 shows the reflection spectrum of this nitridosilicate.

FIG. 2 shows the diffuse reflection spectrum for this phosphor. It reveals a pronounced minimum in the range below 440 nm, which therefore demonstrates the good excitability in this range.

Figure 3:
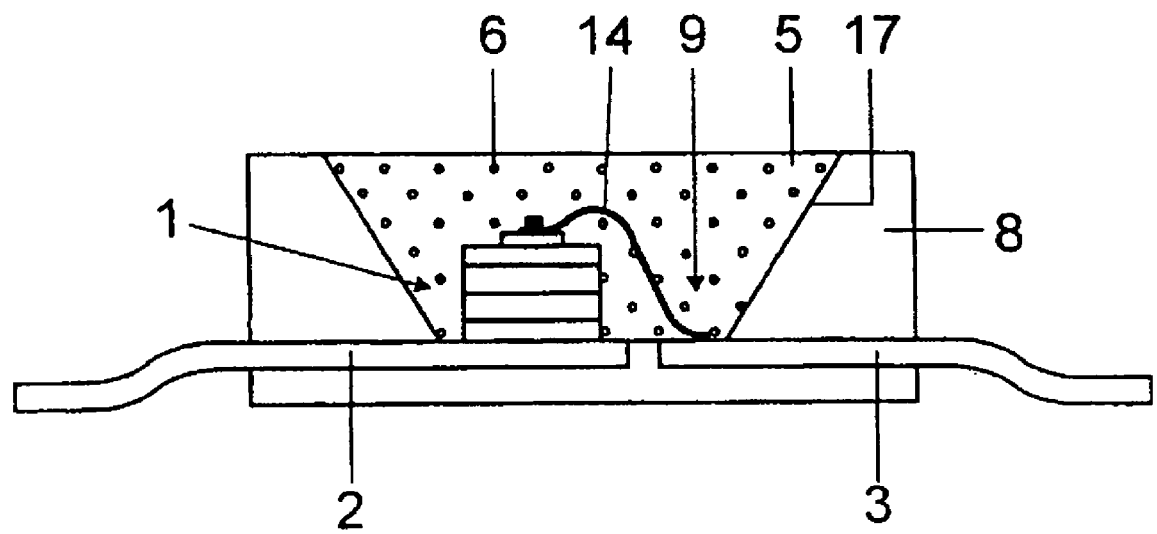
FIG. 3 shows a semiconductor component which serves as light source for green light as a luminescence conversion LED.

FIG. 3 specifically illustrates the structure of a light source for white light. The light source is a semiconductor component having a chip 1 of the InGaN type with a peak emission wavelength in the UV region of, for example, 405 nm, up to 430 nm, which is embedded in an opaque basic housing 8 in the region of a recess 9. The chip 1 is connected to a first terminal 3 via a bonding wire 14 and to a second electrical terminal 2 directly. The recess 9 is filled with a potting compound 5, which as its main constituent contains an epoxy casting resin (80 to 90 mol %) and phosphor pigments 6 (less than 20% by weight). The recess has a wall 17 which serves as a reflector for the primary and secondary radiation from the chip 1 and the pigments 6. The primary radiation of the UV-LED is completely converted into green by the phosphor. The phosphor used is the oxynitridosilicate described above.

Figure 4:
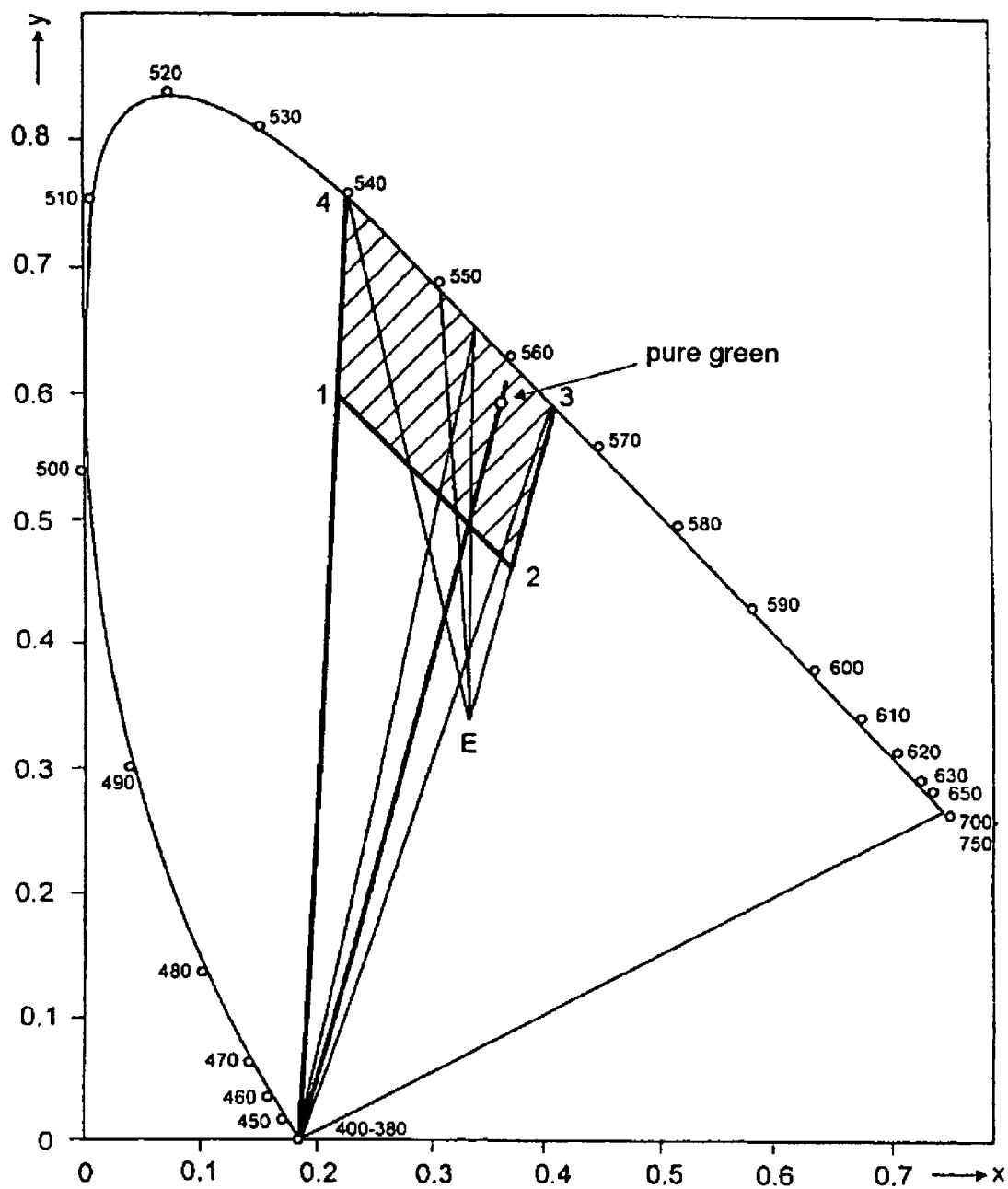
FIG. 4 shows the color diagram with a usable region for pure green indicated as a quadrilateral.

The usable pure green region which is desired here is considered to be a region which in the color diagram is approximately defined by a quadrilateral having the corners (1): x/y=0.22/0.595;

(2): x/y=0.37/0.46;

(3): x/y=0.41/0.59 and (4): x/y=0.225/0.755 cf. in this respect FIG. 4.

Figure 5:
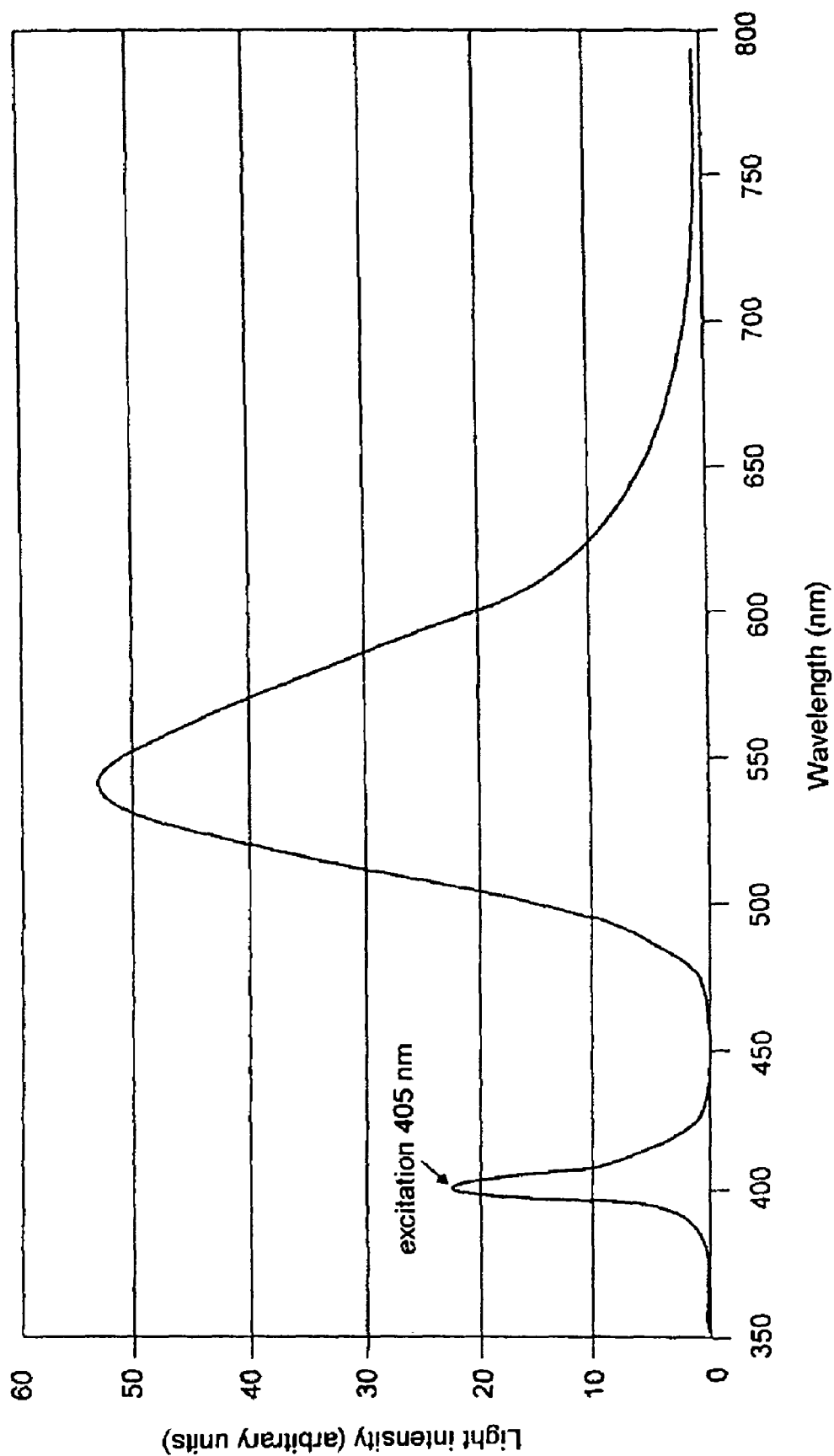
FIG. 5 shows the spectral distribution of the luminescence conversion LED.

FIG. 5 shows the spectral distribution of the emission from a luminescence conversion LED based on an LED primarily emitting UV with a peak at 405 nm.

The invention claimed is:

1. A green-emitting LED which is designed as a luminescence conversion LED, comprising:
a primary radiation source, which is a chip emitting a primary radiation in the UV or blue radiation region; and
a layer of a phosphor which is arranged in front of the primary radiation source and completely or partially converts the primary radiation of the chip into a green emission of dominant wavelength $\lambda_{dom}$=550 to 570 nm;
wherein the phosphor belongs to a class of oxynitridosilicates, having a cation M and an empirical formula $M_{(1-c)}Si_2O_2N_2:D_c$, where D denotes a doping with divalent europium and where M comprises Sr as a constituent and M=Sr alone or M=$Sr_{(1-x-y)}Ba_yCa_x$ with $0 \leq x+y<0.5$ is used, the oxynitridosilicates completely or predominantly comprising a high-temperature-stable modification HT, and the phosphor comprises less than 100 ppm tungsten impurity and less than 100 ppm cobalt impurity.

2. The LED as claimed in claim 1, wherein the Eu fraction makes up between 0.1 and 20 mol % of M.

3. The LED as claimed in claim 1, wherein Sr represents a majority of M and a proportion of M is replaced by Ba and/or Ca.

4. The LED as claimed in claim 3, wherein 30 mol % of M is replaced by Ba and/or Ca.

5. The LED as claimed in claim 1, wherein a proportion of M is replaced by Li and/or La and/or Zn.

6. The LED as claimed in claim 5, wherein up to 30 mol % of M is replaced by Li and/or La and/or Zn.

7. The LED as claimed in claim 1, wherein part of an SiN group in the oxynitridosilicates of formula $MSi_2O_2N_2$ is replaced by an AlO group.

8. The LED as claimed in claim 7, wherein up to 30 mol % of the SiN group is replaced by the AlO group.

9. The LED as claimed in claim 1, wherein a proportion of Eu is replaced by Mn.

10. The LED as claimed in claim 9, wherein up to 30 mol % of Eu is replaced by Mn.

11. The LED as claimed in claim 1, wherein the primary radiation has a peak wavelength in the range from 380 to 430 nm.

12. The LED as claimed in claim 1, wherein the green emission has a dominant wavelength in the range from 556 to 564 nm.

13. The LED as claimed in claim 1, wherein the primary radiation is completely converted.

14. The LED as claimed in claim 1, wherein the chip is an InGaN chip with a peak emission wavelength in the range from 430 to 465 nm.

15. The LED as claimed in claim 1, wherein the LED is dimmable.

16. The LED as claimed in claim 1, wherein a primary radiation has a peak wavelength of at least 380 nm.

* * * * *